US006969992B2

(12) United States Patent
Vaughan et al.

(10) Patent No.: US 6,969,992 B2
(45) Date of Patent: Nov. 29, 2005

(54) PARALLEL TRANSCEIVER FOR NUCLEAR MAGNETIC RESONANCE SYSTEM

(75) Inventors: J. Thomas Vaughan, Stillwater, MN (US); Gregor Adriany, Minneapolis, MN (US); Kamil Ugurbil, Minneapolis, MN (US); John Strupp, Coon Rapids, MN (US); Peter Andersen, Independence, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 0 days.

(21) Appl. No.: 10/957,870

(22) Filed: Oct. 4, 2004

(65) Prior Publication Data

US 2005/0116715 A1 Jun. 2, 2005

Related U.S. Application Data

(60) Provisional application No. 60/508,662, filed on Oct. 3, 2003.

(51) Int. Cl.[7] .............................................. G01V 3/00
(52) U.S. Cl. ...................... 324/318; 324/309
(58) Field of Search ................ 324/318, 319, 324/322, 309, 307, 300; 600/422, 410; 341/139

(56) References Cited

U.S. PATENT DOCUMENTS

| 4,093,823 | A | * | 6/1978 | Chu ........................... 370/535 |
| 4,689,563 | A | * | 8/1987 | Bottomley et al. ......... 324/309 |
| 6,549,799 | B2 | * | 4/2003 | Bock et al. ................. 600/422 |
| 6,621,433 | B1 | * | 9/2003 | Hertz .......................... 341/139 |
| 6,671,329 | B1 | * | 12/2003 | Lenz .......................... 375/297 |
| 6,806,708 | B1 | * | 10/2004 | Lee et al. ................... 324/307 |
| 6,819,274 | B2 | * | 11/2004 | Krone et al. ................ 341/141 |
| 6,861,840 | B2 | * | 3/2005 | Frederick et al. ........... 324/307 |

* cited by examiner

Primary Examiner—Brij B. Shrivastav
(74) Attorney, Agent, or Firm—Schwegman, Lundberg, Woessner & Kluth, P.A.

(57) ABSTRACT

An excitation and detection circuit having individually controllable elements for use with a multi-element radio frequency coil. Characteristics of the driving signal, including, for example, the phase, amplitude, frequency and timing, from each element of the circuit is separately controllable using small signals. Negative feedback for the driving signal associated with each coil element is derived from a receiver coupled to that coil element.

20 Claims, 6 Drawing Sheets

PARALLEL TRANSCEIVER FOR NUCLEAR MAGNETIC RESONANCE SYSTEM

RELATED APPLICATIONS

This application claims priority to U.S. Patent Provisional Application Ser. No. 60/508,662, filed Oct. 3, 2003, and entitled "PARALLEL TRANSCEIVER FOR NUCLEAR MAGNETIC RESONANCE SYSTEM," which is hereby incorporated by reference.

This application is related to U.S. patent application Ser. No. 10/420,541, filed Apr. 21, 2003, and entitled "RADIO FREQUENCY GRADIENT AND SHIM COIL," which is hereby incorporated by reference.

This application is related to U.S. patent application Ser. No. 10/637,261, filed Aug. 8, 2003, and entitled "ASSYMETRIC RADIO FREQUENCY TRANSMISSION LINE ARRAY," which is a continuation of U.S. Pat. No. 6,788,056, filed Jul. 31, 2001, and entitled "RADIO FREQUENCY MAGNETIC FIELD UNIT WITH APERTURE," each of which are hereby incorporated by reference.

This application is related to U.S. Pat. No. 6,633,161, filed May 22, 2000, and entitled "RF COIL FOR IMAGING SYSTEM," which is hereby incorporated by reference.

GOVERNMENT RIGHTS

The present subject matter was partially supported by the National Institute of Health (NIH) under Agency Grant Numbers NIH-R01 CA 94200-01A1, P41 RR08079 and NIH-2 R42 RR13230-02. The United States government may have certain rights in the invention.

TECHNICAL FIELD

This subject matter relates to magnetic resonance imaging, and more particularly, to a method and system for excitation and detection of magnetic resonance signals using a multi-element radio frequency coil.

BACKGROUND

Traditional transceivers are inadequate for exciting and detecting signals using a multi-element magnetic resonance coil. In particular, at high field strengths, inhomogeneity effects often cause image quality to deteriorate.

What is needed is an improved transceiver.

SUMMARY

A system to control and monitor multiple parallel channels of a radio frequency coil on both the transmit and the receive side. Each individual current element (or coil element) generates a field based on the current flowing in that current element. The field amplitude, phase, frequency and timing characteristics generated by each coil element is independently controlled by adjusting the current in that current element. Timing control, in one embodiment, allows selection of periods of "on" and periods of "off" time.

The characteristics of the electric current flowing in each coil element is independently determined based on an input signal level and a control signal delivered to a power amplifier or to a modulator coupled to each coil element.

In one embodiment, each resonant current element of a coil is separately addressed and independently controlled based on feedback received using an optimization algorithms.

Other aspects of the invention will be apparent on reading the following detailed description of the invention and viewing the drawings that form a part thereof.

BRIEF DESCRIPTION OF THE DRAWINGS

In the drawings, like numerals describe substantially similar components throughout the several views. Like numerals having different letter suffixes represent different instances of substantially similar components.

DETAILED DESCRIPTION

In the following detailed description, reference is made to the accompanying drawings that form a part hereof, and in which is shown, by way of illustration, specific embodiments in which the present subject matter may be practiced. These embodiments are described in sufficient detail to enable those skilled in the art to practice the subject matter, and it is to be understood that the embodiments may be combined, or that other embodiments may be utilized and that structural, mechanical, logical and electrical changes may be made without departing from the scope of the present subject matter. The following detailed description is, therefore, not to be taken in a limiting sense, and the scope of the present subject matter is defined by the appended claims and their equivalents.

Figure 1:
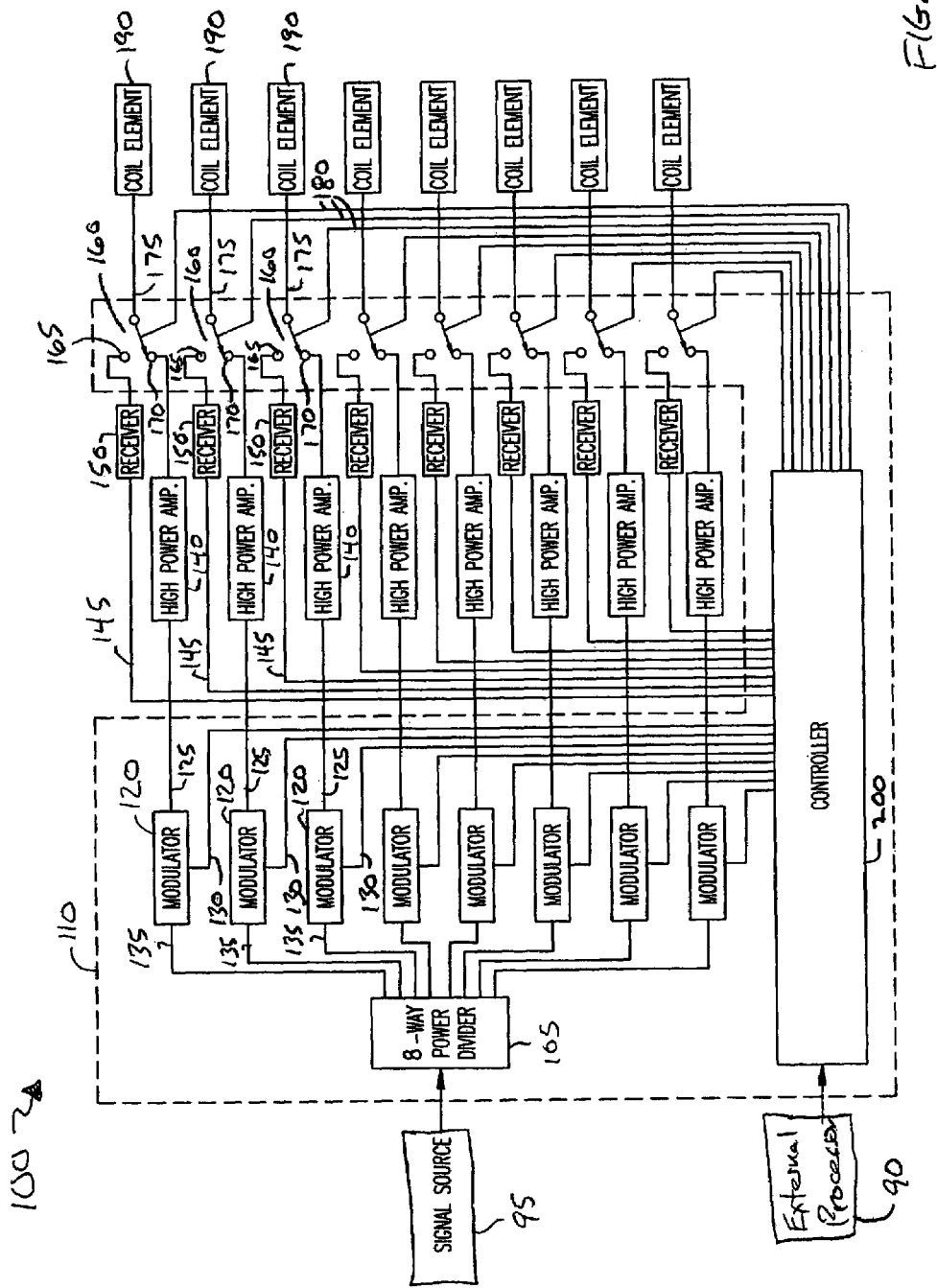
FIG. 1 includes a block diagram of an eight-element transceiver according to one embodiment of the present subject matter.

FIG. 1 illustrates transceiver 100 according to one embodiment of the present subject matter. In the figure, transceiver 100 includes signal source 95 having an output coupled to an input terminal of divider 105. Divider 105 is illustrated as an 8-way power divider, however, this is merely illustrative and other dividers, having more or less ways are also contemplated. For example, in one embodiment a 16-way divider is provided. Divider 105 provides a plurality of output signals, and in the embodiment shown, eight output signals are depicted. The number of output signals corresponds to the division factor of the power divider or splitter. In one example, the divider is part of an interface circuit having an input terminal and a plurality of output signals provided on each of a plurality of output terminals.

Each output signal from the divider, or interface circuit, is separately coupled to input 135 of modulator 120. Each modulator 120 provides an output at terminal 125. In addition, each modulator is further coupled to controller 200 via separate control lines 130. From terminal 125, each modulator 120 is coupled to an input of amplifier 140. In one example, modulator 120 includes an amplifier. In the embodiment illustrated, amplifier 140 includes a high power amplifier. An output of amplifier 140 is coupled to switch 160 at first node 170. Each switch 160 also includes second node 165 coupled to receiver 150. Each receiver 150 is further coupled to controller 200 via receiver output 145. Each switch 160 includes a pole connection at node 175 which is further coupled to coil element 190. Each switch 160 is controlled by a separate control line 180 coupled to controller 200.

In one example, the interface circuit includes, or is coupled to, multiple parallel input signal sources and not with a power divider. For example, multiple independent driving signals are connected in parallel with the interface circuit.

Controller 200, in various embodiments, includes a processor or a signal processor. Controller 200 is coupled to a external processor 90. External processor 90, in one embodiment, is a remote processor and is coupled to controller 200 by an RS-232 interface, an Ethernet, a general purpose interface bus (GPIB) or other connection.

Other control lines coupled to controller 200 are also contemplated. For example, in various embodiments, a control line is coupled to power amplifier 140, receiver 150 and divider 105. In addition, a feedback is provided to controller 200 using one or more control lines or separate feedback lines.

In one embodiment, each receiver 150 is coupled to controller 200 by a signal processor. In one embodiment, the present system is configured to not generate an image in which case a feedback signal from receiver 150 is used to adjust a parameter. For example, in one embodiment, a histogram is generated and an algorithm executed on a processor is adapted to drive the histogram flat.

In one embodiment, the radio frequency transmit signals are relatively small and thus can be readily controlled in terms of phase, frequency and amplitude.

In one embodiment, assembly 110 is provided on a particular structure such as a circuit board or in a chassis.

In one embodiment, a driver and a pre-amplifier are coupled to each coil element. In one embodiment, the amplifier includes a solid state amplifier. In one embodiment, the amplifier includes one or more power field effect transistor (FET) having a device rating of between approximately 150 and 500 watts.

Figure 2:
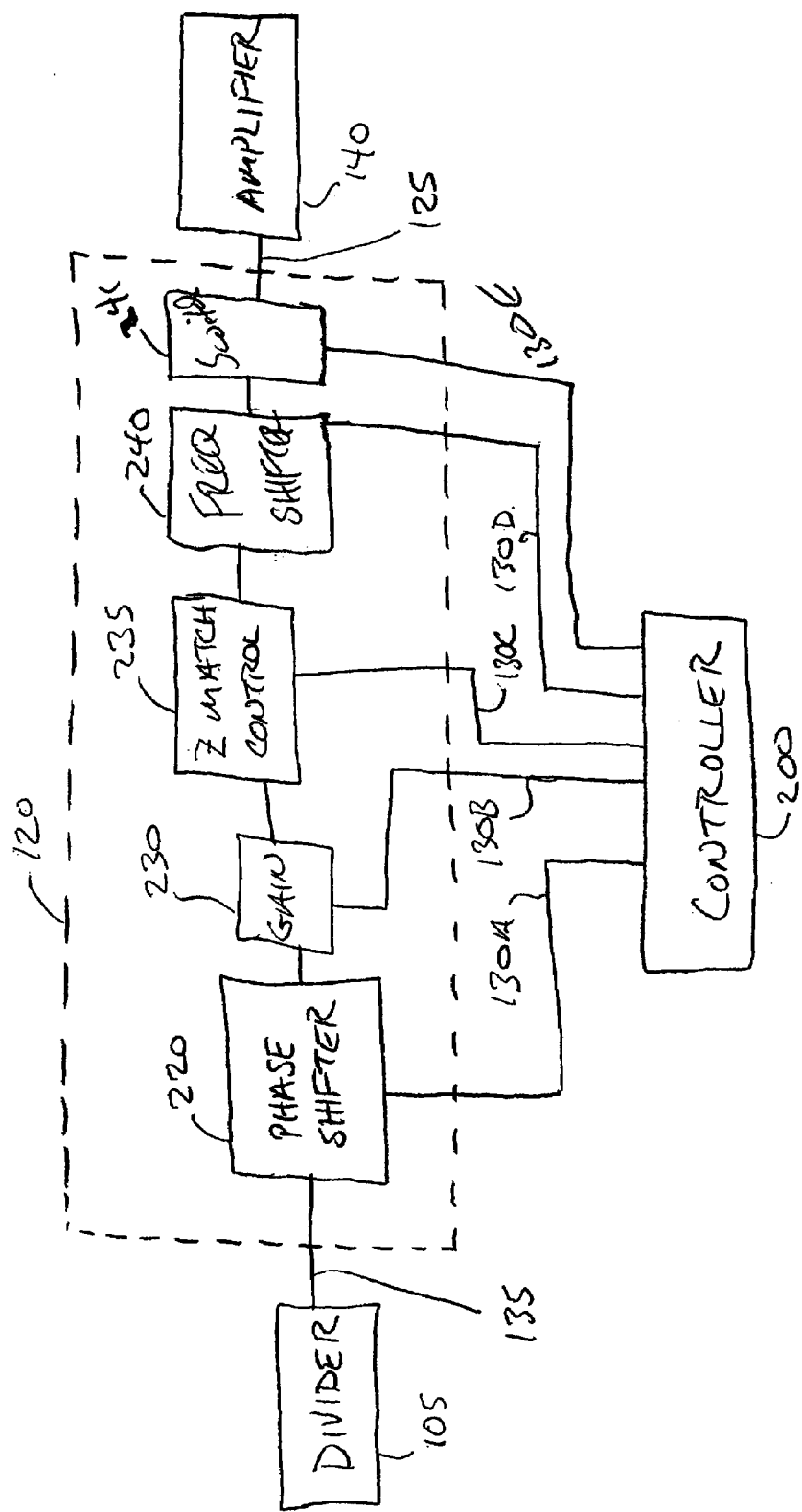
FIG. 2 includes a block diagram of a modulator according to one embodiment of the present subject matter.

FIG. 2 illustrates modulator 120 according to one embodiment. In the figure, modulator 120 includes phase shifter 220, gain 230, impedance match control 235 and frequency shifter 240 in series connection. Other configurations are also contemplated, however the embodiment shown is illustrative. Divider 105 provides a signal on input 135 to modulator 120. Modulator 120 provides an output at terminal 125 which is coupled to amplifier 140. Each of phase shifter 220, gain 230, impedance match control 235 and frequency shifter 240 are coupled to controller 200 via control lines 130A, 130B, 130C and 130D, respectively. Switch 241, also connected in series, provides control for the power delivered to amplifier 140, and thus, the current element. The power for a coil element, in one example, is modulated on and off according to a selected operating parameter. Switch 241 is controlled by control line 130E.

Phase shifter 220, gain 230, impedance match controller 235 and frequency shifter 240, in various embodiments, includes PIN diodes, filters and other active and passive circuit elements. Phase shifter 220 introduces a phase shift as a function of a signal provided by controller 200 on control line 130A. In one embodiment, gain 230 includes a programmable attenuator and is configured to adjust a signal amplitude delivered to amplifier 140. In one embodiment, gain 230 includes a switch to selectively turn on or off an output signal from modulator 120 as a function of a signal on control line 130B. In one embodiment, gain 230 includes an amplifier having a variable gain as determined by a signal on control line 130B. In one embodiment, impedance match control 235 includes an impedance bridge or voractor or other circuit or component to provide feedback and control to match each current element to the load presented. In one embodiment, frequency shifter 240 adjusts the frequency as a function of a signal from controller 200 using control line 130D.

In other embodiments, modulator 120 includes an amplifier gain control to control the amplitude of the radio frequency signal. As indicated in the figure, the modulator is controlled by a control line coupled to controller 200. In one embodiment, a control line is coupled to each power amplifier 140.

Figure 3:
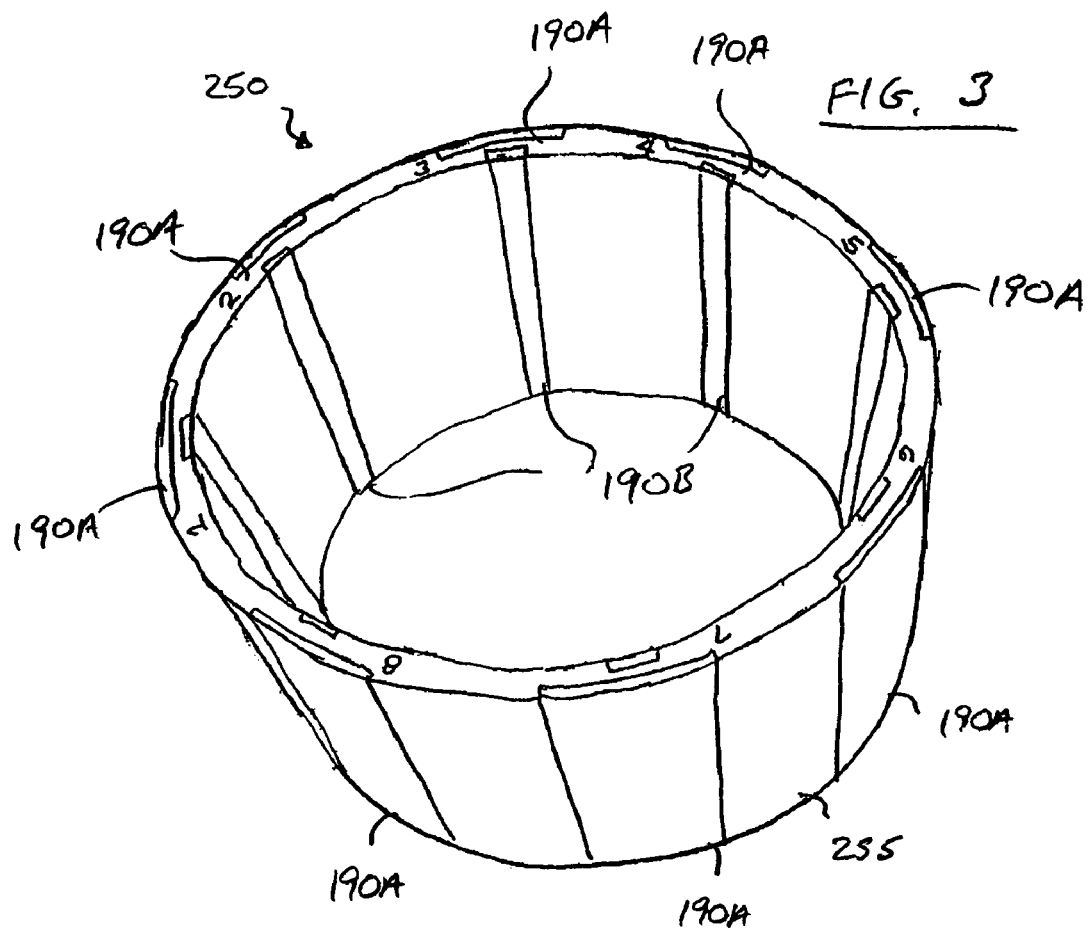
FIG. 3 includes a view of a volume coil according to one embodiment of the present subject matter.

FIG. 3 illustrates multi-element radio frequency coil 250 according to one embodiment of the present subject matter. In the figure, an 8-element coil is illustrated, however more or less elements are contemplated. For example, in various embodiments, coil 250 includes 4-elements, 16-elements and 32-elements. In the figure, coil 250 includes parallel conductive strips arranged concentrically about form 255. Form 255 is fabricated of non-conductive material. Inner conductive strips 190B are illustrated to be of smaller cross-section than that of outer conductive strips 190A.

Referring again to FIG. 1, each switch 160 is coupled to coil element 190 and pursuant to coil 250 of FIG. 3, each switch is coupled to conductive strips 190A and 190B.

Coil 250, is sometimes referred to as a transverse electromagnetic (TEM) coil and in various embodiments, includes multiple strip-lines, micro-strips, or current elements, each element of which can be independently controlled inductively and capacitively to allow control of phase, amplitude, frequency and timing.

Figure 4:
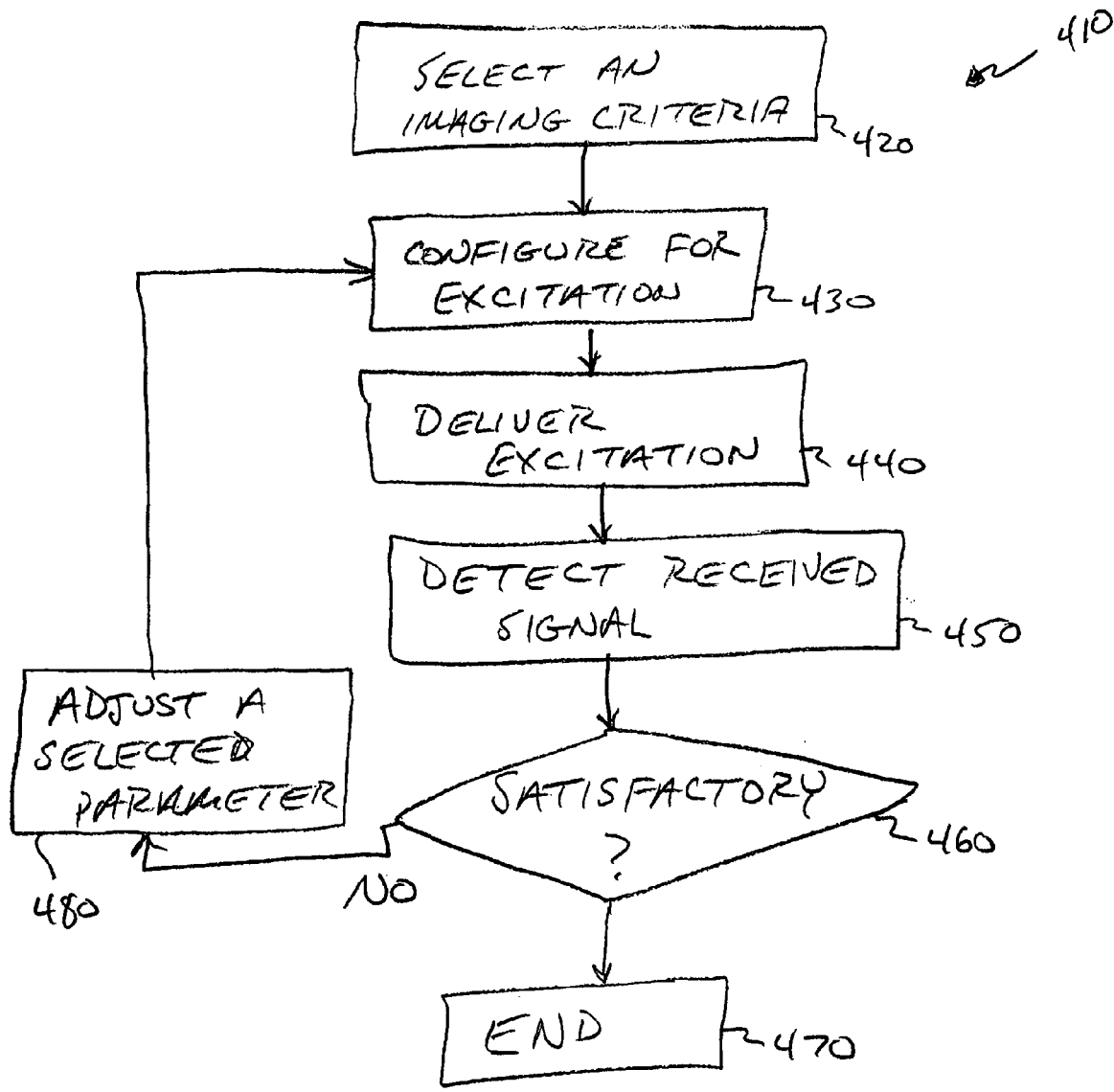
FIG. 4 includes a flow chart of a method according to one embodiment of the present subject matter.

FIG. 4 illustrates method 410 according to one embodiment of the present subject matter. As 420, an imaging criteria is selected. In various embodiments, the imaging criteria may describe a particular signal to noise ratio, image homogeneity, a minimum contrast to noise ratio or may describe a particular region of interest to be examined. In one embodiment, the imaging criteria is selected using a menu or interface presented by a computer. In one embodiment, the imaging criteria is selected automatically by a processor executing instructions stored on computer-readable media.

At 430, transceiver 100 is configured to deliver excitation according to the selected imaging criteria. Configuring transceiver 100, in various embodiments, includes selecting an amplitude, phase and frequency for the current in each coil element 190. In one embodiment, configuring transceiver 100 includes determining when to turn on or turn off a particular coil element 190. In one embodiment, configuring transceiver 100 includes selecting a pulse sequence to be delivered using coil 250.

At 440, an excitation field is delivered to a subject using coil 250. In one embodiment, excitation is delivered by modulating a radio frequency current in each individual coil element 190. Delivering excitation, in one embodiment, entails configuring each switch 160 to provide coil elements 190 with a signal derived from amplifier 140.

At 450, a received signal is detected, again using individual coil elements 190. In particular, the received signal is detected by configuring switch 160 such that a signal received on coil element 190 is coupled to controller 200.

At 460, a query is presented to determine if the image resulting from the received signal satisfies predetermined criteria. If the resulting image satisfies the predetermined criteria, then processing ends at 470. If the resulting image does not satisfy the predetermined criteria, then processing proceeds to 480 wherein a selected parameter is adjusted. For example, in one embodiment, the selected parameter is a current amplitude, in which case, at 480, the amplitude is increased or decreased for a particular coil element 190 as a function of the image generated. Following adjustment of the selected parameter at 480, processing continues by configuring for excitation at 430.

In one embodiment, method 410 is implemented by a processor executing instructions stored on computer-readable media. In various embodiments, the processor includes external processor 90 or a processor of controller 200.

Figure 5:
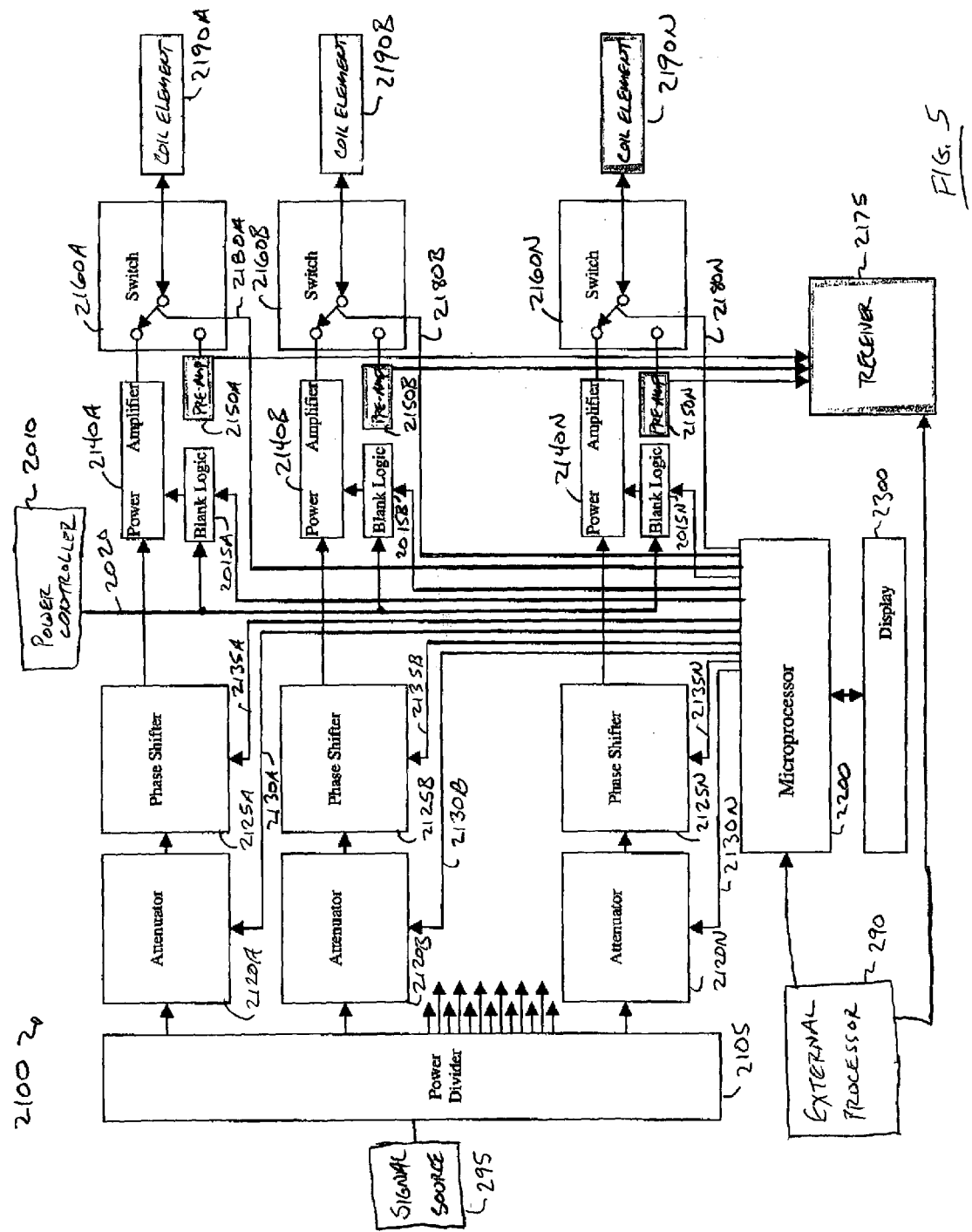
FIG. 5 includes a block diagram of an n-element transceiver according to one embodiment of the present subject matter.

FIG. 5 illustrates transceiver 2100 according to one embodiment of the present subject matter. In the figure, transceiver 2100 includes signal source 295 having an output coupled to an input terminal of power divider 2105. Power divider 2105 is an n-way power divider, where the power is evenly distributed across n output channels. For example, power divider 2105, in various examples, includes an 8-port divider, a 16-port divider or a divider having more or less channels.

Power divider 2105 provides a plurality of output signals, and in the embodiment shown, n output signals are depicted. The number of output signals corresponds to the division factor of the power divider or splitter. Each output signal from power divider 2105 is separately coupled to attenuator 2120A, 2120B to 2120N. In addition, the output from attenuators 2120A to 21020N are coupled to phase shifter 2125A, 2125B to 2125N. Attenuators 2120A to 21020N and phase shifters 2125A to 2125N are configured to modulate the signal from the signal source and are sometimes referred to as elements of a modulator. Each element of the modulator, for example, attenuator 2120A and phase shifter 2125A, are coupled to microprocessor 2200 via lines 2130A and 2135A, respectively. Lines 2130A and 2135A, in various embodiments, provides control of the particular element or provides a feedback signal corresponding to a mode of operation or setting of the particular element.

Power controller 2010 is coupled to blank logic 2015A, 2015B to 2015N, which is, in turn, coupled to power amplifier 2140A, 2140B to 2140N. Power amplifiers 2140A to 2140N receive an output signal from phase shifters 2125A to 2125N and provide an amplified signal to switches 2160A, 2160B to 2160N. Electrical power to power amplifiers 2140A to 2140N is controlled by the combination of power controller 2010 and blank logic 2015A to 2015N.

Switches 2160A to 2160N coupled coil elements 2190A, 2190B to 2190N, to power amplifiers 2140A to 2140N or pre-amplifier 2150A, 2150B to 2150N, respectively. Control of the mode of operation and feedback relative to switches 2160A to 2160N is provided via lines 2180A, 2180B to 2180N, each of which are coupled to microprocessor 2200. Output signals from each of pre-amplifiers 2150A to 2150N are coupled to receiver 2175, which is further coupled to external processor 290. Display 2300 is coupled to microprocessor 2200 and renders graphical or numerical data corresponding to the operation of system 2100.

Figure 6:
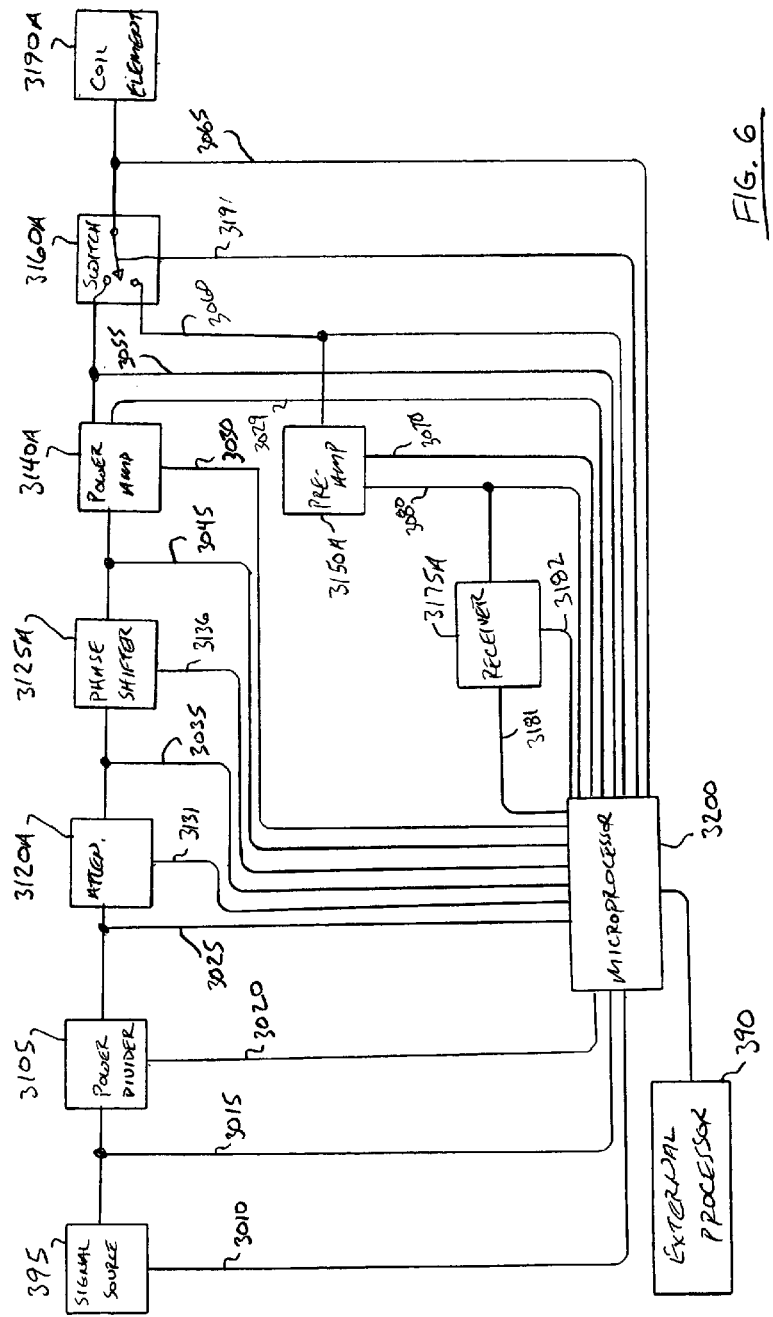
FIG. 6 includes a block diagram of an exemplary element of a multi-element transceiver according to one embodiment of the present subject matter.

FIG. 6 illustrates particular channel 3100 of a multi-channel transceiver, portions of which are depicted in FIGS. 1, 2 and 5. Signal source 395 generates an excitation signal which is provided to power divider 3105. The output from power divider 3105 is coupled to attenuator 3120A which is further coupled to phase shifter 3125A. The output from phase shifter 3125A is coupled to power amplifier 3140A which is further coupled to a first node of switch 3160. A second node of switch 3160 is coupled to pre-amplifier 3150A which is also coupled to receiver 3175A. An output from receiver 3175A is coupled to microprocessor 3200. An output of switch 3160 is coupled to coil element 3190A. Each of signal source 395, power divider 3105, attenuator 3120A, phase shifter 3125A, power amplifier 3140A, pre-amplifier 3150A, receiver 3175A and switch 3160 is coupled to microprocessor 3200 by links 3010, 3020, 3131, 3136, 3030, 3070, 3182 and 3191, respectively. In one example, links 3010, 3020, 3131, 3136, 3030, 3070, 3182 and 3191 each provide a feedback signal as to the mode of operation of the particular element. In one example, a control signal is provided to each element via links 3010, 3020, 3131, 3136, 3030, 3070, 3182 and 3191.

In addition, in one example, signal feedback is provided between each element. For example, feedback lines 3015, 3025, 3035, 3045, 3055, 3065, 3060, 3080 and 3081 provide feedback to microprocessor 3200 as to the signal carried between the particular elements as illustrated. External processor 390 is coupled to microprocessor 3200 and provides additional processing, display and control functions.

ALTERNATIVE EMBODIMENTS

Adjusting the phase and the frequency provides control over the individual current elements. In one embodiment, a pulse sequence is delivered to selected current elements of the coil.

The criteria selected for imaging or other application, in various embodiments, includes at least one of any combination of image uniformity and signal-to-noise. In one embodiment, a region of interest is enhanced based on specific criteria, such as contrast. Other algorithms are also contemplated to generate pulses or provide other driving signals.

Feedback present in various embodiments of the present subject matter can be described as relative to the transmit side as well as the receive side of the transceiver. For example, on the transmit side, individual current elements, as well as modulator 120 can provide a feedback signal corresponding to a performance criteria. In particular, in the event of an impedance mismatch between a driver and a load presented, a measure of a reflected signal (standing wave ratio, SWR) on a line can provide a signal to controller 200 to allow re-configuration of the modulator. As another example, feedback as to a measure of total power delivered to coil 250 can be used as a safety mechanism to prevent excessive power delivery to a subject. Other parameters can also be monitored with feedback on the transmit side. For example, the frequency, amplitude and phase of a delivered signal can be monitored to verify that the parameter called for was called for was actually delivered.

On the transmit side, changes in the phase, amplitude and frequency of a given current element provides nearly instantaneous feedback as to the affected magnetic resonance signal. A control signal is generated as a function of the feedback received and is used to modify the transmitter response by changing one or more parameters associated with the driving signal for at least one particular current element of the coil.

In one embodiment, three types of signals are present in transceiver 100 which can be described as radio frequency drive signals, control signals and feedback signals. The radio frequency drive signals, in various embodiments, are manipulated using amplifiers, filters, signal processors and other elements to provide a signal tailored to a predetermined criteria. The radio frequency drive signals are manipulated and controlled using the signals on the control lines and feedback signals. The independent radio frequency transmit and receive signal, along with independent control over independent coil elements, and feedback from selected elements allows a particular region of interest to be targeted or optimized in an nuclear magnetic resonance sample.

In one embodiment, the present system provides multiple radio frequency signal channels for transmitting to, and receiving from, multiple radio frequency coil elements. In one embodiment, the present system provides multiple control signal circuits for independently controlling transmit and receive functions in each of the various current elements of the magnetic resonance radio frequency coil. In one embodiment, the present system provides multiple radio frequency signal feedback loops for sampling radio frequency signals transmitted to, and received from, the multiple radio frequency coil elements. In one embodiment, the present system includes computer readable instructions adapted to adjust a radio frequency signal feedback according to predetermined criteria. In one embodiment, the present system includes transmit, receive, and coil control protocols adapted to achieve predetermined nuclear magnetic resonance data from a region of interest in a sample (e.g. human body) according to predetermined criteria.

In various embodiments, predetermined criteria includes at least one of any combination of signal-to-noise, spatial resolution, spatial location, spatial dimension, spatial uniformity, temporal resolution, timing, duration, various contrast attributes, phase angle and frequency.

The present subject matter is suited for use with magnetic resonance imaging (MRI), magnetic resonance spectroscopy (MRS), functional magnetic resonance imaging (fMRI), electron paramagnetic resonance (EPR), and electron spin resonance (ESR) as well as nuclear magnetic resonance (NMR) and where this document refers to nuclear magnetic resonance, it is understood that others are also included.

The operational (Larmor) frequency for proton imaging increases linearly with field strength. Accordingly, the wavelength decreases, especially in the tissue dielectric. For example, the wavelength in brain tissue at 7 Tesla (300 MHz) decreases to approximately 12 cm. Consequently, human head and body imaging become increasingly non-uniform with increasing field strength. A multi-element coil, according to the present subject matter, provides interactive phase and amplitude control over the independent coil elements and can thus, correct spatial non-uniformities in the image or magnify a predetermined region of interest for additional signal from that region.

In one example, power divider 2105 includes a 16-port zero degree power divider and signal source 295 includes a directional coupler. In one example, attenuators 2120A to 2120N include an 8-bit digital attenuator. In one example, phase shifter 2125A to 2125N include an 8-bit digital phase shifter. In one example, power controller 2010 includes a blank transistor—transistor logic (TTL) array. In one example, power amplifier 2140A to 2140N includes a power field effect transistor (FET) amplifier having a 500 watt rating.

Figure 7:
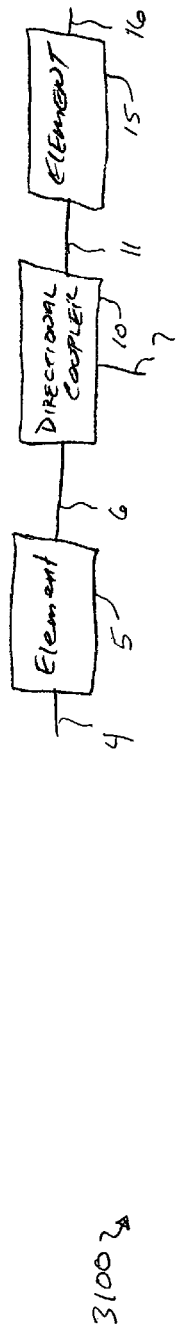
FIG. 7 illustrates a directional coupler in a portion of a circuit.

FIG. 7 illustrates exemplary directional coupler 10 coupled between element 5 and element 15. In the figure, element 5 and element 15 each corresponds to a component or element as described herein. In one example, element 5 represents power divider 3105 and element 15 represents attenuator 3120A. Element 5 generates output signal 6 as a function of input signal 4. In addition, element 15 generates output signal 16 as a function of input signal 11. Directional coupler 10 provides an output, or feedback, signal 7 as a function of signal 6. A directional coupler is but one device for sampling a signal. Other exemplary devices include a PIN diode and an oscilloscope probe.

In one example, an optical converter and an optical fiber are used to couple particular elements. In one example, a radio frequency filter circuit and a Faraday cage are used to isolate selected portions of the circuit.

In various examples, multiple channels are provided, including, for example, 4-channels, 8-channels, 16-channels as well as less or greater numbers of channels.

In one example, the present subject matter includes a multi-channel transmitter configured to provide a multi-channel driving signal to a multi-element radio frequency coil where each current element of the coil is driven by a separate and independently controlled excitation signal. The electrical signal provided by each channel of the multi-channel transmitter is independently controllable.

In one example, the present subject matter includes a multi-channel receiver configured to receive a multi-channel response signal from a multi-element radio frequency coil where each current element of the coil provides a separate and independent output signal. The output signal provided by each channel of the multi-channel receiver is independently controllable and independently, processed, amplified and filtered. In one example, a power modulator, or power controller is provide to adjust the time of powering of a current element.

In one example, the present subject matter includes a multi-channel transmitter and receiver, or transceiver, configured to provide a multi-channel driving signal to a multi-element radio frequency coil and receive a multi-channel response signal.

In one example, the signal source includes a directional coupler which bleeds off a sample of the communicated signal. For example, transmitted power coupled to one port is passively coupled to an output port of the directional coupler.

In one example, multiple signal sources, each operating independently can be coupled to the power divider or splitter.

In one example, power controller 2010 includes a circuit to turn on and off supply current to power amplifiers 2140A to 2140N. Power amplifiers 2140A to 2140N are normally held in a hard off position to reduce noise introduction and selectively turned on when triggered. In one example, power modulation to control on and off cycles of the excitation signal is provided by a separate power modulator as part of modulator 120 of FIG. 1.

In various examples, the present subject matter includes feedback derived from a variety of sources, including, for example, system feedback, signal feedback and processed signal feedback.

System feedback, in one example, includes circuitry and connections to allow microprocessor 2200 to monitor the operation and mode of selected components in the system. For example, link 2180A provides a system feedback signal corresponding to the mode of operation of switch 2160A. The system feedback signal, in one example, provides a signal to indicate that the component or element is operating properly. In various examples, selected components are configured to provide a status signal.

Signal feedback, in one example, includes circuitry and connections to allow monitoring of the signal. For example, signal feedback is derived from a directional coupler which can provide data corresponding to a transmitted or received signal. The signal feedback can include, for example, data corresponding to the phase, frequency, amplitude and on or off state of a particular signal.

As to a transmitted signal, a directional coupler can operate as a signal detector. For example, a small amount of transmitted energy is detected in a forward direction and a reflected (or return) signal is also detectable. In one example, with respect to FIG. 6, the signals on link 3015 and 3025 are provided to microprocessor 3200 by a directional coupler. In one example, a directional coupler is provided between each element of the multi-channel transceiver. The signal feedback provides data corresponding to the settings and status of that particular module. For example, the amount of attenuation provided by attenuator 3120A is discernable based on the signal fed back on link 3035.

In one example, a directional coupler at the output side of switch 3160A, which provides feedback signal 3065, allows monitoring of the excitation signal delivered to coil element 3190A.

Signal feedback provides a tool to verify signal integrity. For example, extraneous and spurious signals can be detected using signal feedback. Signal feedback, in one example, also provides a measure of the reflected power. In addition, signal feedback provides data corresponding to the power delivered to the coil, and thus, allows monitoring for safe levels of power for patient safety and equipment protection.

In one example, a directional coupler is used to provide signal feedback corresponding to a received signal. The directional coupler used to monitor the received signal may be the same or different than that used for monitoring a transmitted signal. In one example, a directional coupler is provided after pre-amplifier 3150A. In one example, feedback from the directional coupler is provided to microprocessor 3200 where programming is executed to adjust system performance based on the feedback signal.

In one example, signal feedback is provided on the receive side. In one example, signal feedback is provided on the transmit side. In one example, signal feedback is provided on both the receive side and on the transmit side. The signal feedback is generated by a directional coupler at any point in the system. In one example, system component feedback is provided.

With respect to the method illustrated in FIG. 4, the feedback signal is detected at 450 and a processor executes an algorithm based on the feedback signal at 460.

Signal feedback provides data corresponding to signal integrity (verification), signal optimization and safety. Signal integrity (verification) provides data corresponding to what signal was actually transmitted or received. If the signal transmitted or received differs from an expected signal, as determined by the processor, then an operating parameter can be adjusted accordingly. Signal optimization relates to an iterative routine, based on signal amplitude, phase, timing relationship or frequency, that allows the operating parameters to be adjusted to achieve desired performance results. Safety relates to how much power is being conveyed to the coil element while transmitting. In particular, safety relates to how much power can the patient safely sustain as well as how much power can the equipment sustain. Sensitive power limited components include, for example, switches and pre-amplifiers. In addition, power levels on the receive side are also monitored by the processor.

Processed signal feedback corresponds to the feedback derived from a processed signal used to make an image or spectral line. In various examples, processed signal feedback is provided to improve the image quality or homogeneity or for other reason. Processed signal feedback, in one example, is implemented as a set of instructions executable by the processor and provides automated adjustment of operating parameters. Processed signal feedback, in one example, is manually implemented to improve image quality or spectra. In various examples, the feedback is interactive or automated.

In one example, all current elements of a coil are driven (transmit side) with an aggregate signal transmitted on a single channel and multiple receive signals processed using multiple channels as described herein. In one example, multiple current elements are driven using multiple channel driving signals (transmit side) and all current elements of the coil are driven with an aggregate signal transmitted on a single channel and the multiple receive signals are processed using multiple channels.

CONCLUSION

The above description is intended to be illustrative, and not restrictive. Many other embodiments will be apparent to those of skill in the art upon reviewing the above description.

What is claimed:

1. A system comprising:
a processor having a plurality of control lines;
a plurality of signal modulators, each signal modulator having a modulator input, a modulator output and a control input and wherein each control input is coupled to a respective one control line of the plurality of control lines;
an interface circuit having an input terminal and a plurality of output terminals, each output terminal coupled to a respective one modulator input;
a plurality of switches, each switch having a transmit input terminal, a receive output terminal, a coil terminal and a control terminal wherein each control terminal is coupled to a respective one control line, wherein each coil terminal is configured to couple with a coil element of a multi-element magnetic resonance coil with each coil element corresponding to a respective one coil terminal; and
a plurality of receivers, each receiver having coupled to a respective one receive output terminal.

2. The system of claim 1 wherein each modulator includes at least one of an amplifier, an attenuator, a frequency shifter, a phase shifter and a power modulator.

3. The system of claim 2 wherein the power modulator includes a switch.

4. The system of claim 1 wherein the interface circuit includes a divider.

5. The system of claim 1 wherein:
each receiver includes a signal output and the controller includes a plurality of feedback input terminals and wherein each signal output is coupled to a respective one feedback input terminal.

6. The system of claim 4 wherein the controller includes a processor adapted to adjust a control signal on a control line as a function of a feedback signal on a feedback input terminal.

7. The apparatus of claim 1 wherein the input interface includes a power divider.

8. The apparatus of claim 1 wherein each feedback line is coupled to at least one directional coupler.

9. The apparatus of claim 1 wherein each output channel includes at least one of an attenuator, an amplifier, a phase shifter, a frequency shifter and a power modulator.

10. The apparatus of claim 1 wherein each receiver of the plurality of receivers includes an amplifier.

11. The apparatus of claim 1 wherein at least one feedback line is coupled to at least one of an attenuator, an amplifier, a phase shifter, a frequency shifter and a power modulator.

12. The apparatus of claim 1 wherein the input interface includes at least one of a parallel signal source, an 8-port divider and a 16-port divider.

13. The apparatus of claim 1 wherein the output channel includes an impedance controller.

14. The apparatus of claim 1 wherein output channel includes a field effect transistor power amplifier.

15. The apparatus of claim 1 wherein at least one control line is coupled to a digital gain controller.

16. A method comprising:
selecting an imaging criteria;
configuring a multi-channel transceiver for excitation based on the imaging criteria, wherein each channel of the transceiver is coupled to a respective one of a plurality of current elements of a multi-element radio frequency magnetic resonance coil;
delivering excitation to the coil;
detecting a plurality of received signals as a function of the excitation;
evaluating the received signals as a function of the imaging criteria; and
adjusting a selected parameter of at least one channel of the transceiver, each channel controllable independent of any other channel of the transceiver.

17. The method of claim 16 wherein adjusting the selected parameter includes adjusting at least one of a phase shift, a frequency, an amplitude and a powered time.

18. The method of claim 16 wherein evaluating the received signals includes receiving a feedback signal.

19. The method of claim 16 wherein evaluating the received signals includes evaluating a mode of operation of a component of the transceiver.

20. An apparatus comprising:
an input interface having a plurality of output channels;
a processor coupled to the input interface by a plurality of control lines and a plurality of feedback lines, each control line and each feedback line corresponding to a respective one output channel;
a plurality of switches, each switch coupled to a respective one output channel and coupled to the processor and further wherein each switch is adapted for coupling to a respective one current element of a multi-current element magnetic resonance coil;
a plurality of receivers, each receiver coupled to a respective one switch of the plurality of switches; and wherein the switch is configured to select one of the input interface and the plurality of receivers.

* * * * *

UNITED STATES PATENT AND TRADEMARK OFFICE
CERTIFICATE OF CORRECTION

PATENT NO.        : 6,969,992 B2                                              Page 1 of 1
APPLICATION NO.   : 10/957870
DATED             : November 29, 2005
INVENTOR(S)       : J. Thomas Vaughan et al.

It is certified that error appears in the above-identified patent and that said Letters Patent is hereby corrected as shown below:

In the Specification:

In Column 1, Lines 26 to 32 delete the following:

"GOVERNMENT RIGHTS

The present subject matter was partially supported by the Natonal Institute of Health (NIH) under Agency Grant Numbers NIH-R01 CA 94200-01A1, P41 RR08079 and NIH-2 R42 RR13230-02 awarded by the National Institutes of Health. The United States government may have certain rights in the invention."

and add the following:

--GOVERNMENT INTEREST

This invention was made with government support under R01-CA94200-01A1, P41-RR008079 and 2R42-RR013230-02 awarded by the National Institutes of Health. The government has certain rights in the invention.--

Signed and Sealed this
Thirtieth Day of April, 2013

Teresa Stanek Rea
*Acting Director of the United States Patent and Trademark Office*